United States Patent
Umeda et al.

(10) Patent No.: US 9,553,561 B2
(45) Date of Patent: Jan. 24, 2017

(54) VIBRATING DEVICE AND MANUFACTURING METHOD THERFOR

(71) Applicant: Murata Manufacturing Co., Ltd., Nagaokakyo-shi, Kyoto-fu (JP)

(72) Inventors: Keiichi Umeda, Nagaokakyo (JP); Takehiko Kishi, Nagaokakyo (JP); Toshio Nishimura, Nagaokakyo (JP); Takashi Hase, Nagaokakyo (JP)

(73) Assignee: MURATA MANUFACTURING CO., LTD., Nagakakyo-shi, Kyoto-fu (JP)

( * ) Notice: Subject to any disclaimer, the term of this patent is extended or adjusted under 35 U.S.C. 154(b) by 196 days.

(21) Appl. No.: 14/643,286

(22) Filed: Mar. 10, 2015

(65) Prior Publication Data

US 2015/0180449 A1 Jun. 25, 2015

Related U.S. Application Data

(63) Continuation of application No. PCT/JP2013/073323, filed on Aug. 30, 2013.

(30) Foreign Application Priority Data

Sep. 13, 2012 (JP) ................................. 2012-201878

(51) Int. Cl.
| | |
|---|---|
| *H03H 9/21* | (2006.01) |
| *H03H 3/007* | (2006.01) |
| *H03H 9/02* | (2006.01) |
| *H03H 9/24* | (2006.01) |
| *H01L 41/29* | (2013.01) |
| *H01L 41/31* | (2013.01) |

(52) U.S. Cl.
CPC ................ *H03H 9/21* (2013.01); *H01L 41/29* (2013.01); *H01L 41/31* (2013.01); *H03H 3/0072* (2013.01); *H03H 9/02448* (2013.01); *H03H 9/2489* (2013.01); *Y10T 29/42* (2015.01)

(58) Field of Classification Search
CPC ..... B06B 1/0659; G01C 19/5607; H03H 3/04; H03H 2003/026; H03H 2003/0492; H03H 9/21; H03H 9/215; H03H 9/2468; H03H 9/2473; H03H 9/2484; H03H 9/2494
USPC .......................... 310/370; 333/200; 331/156
See application file for complete search history.

(56) References Cited

U.S. PATENT DOCUMENTS

| | | |
|---|---|---|
| 4,358,745 A | 11/1982 | Miller et al. |
| 6,010,919 A | 1/2000 | Matsuhiro et al. |

(Continued)

FOREIGN PATENT DOCUMENTS

| | | |
|---|---|---|
| JP | 57-162513 | 10/1982 |
| JP | 58-160317 | 9/1993 |

(Continued)

OTHER PUBLICATIONS

Callcott, "Electronic Effects in the Elastic Constants of n-Type Silicon" Physical Review, vol. 161, No. 3, Sep. 15, 1997.
PCT/JP2013/073323 Copy of ISR dated Feb. 18, 2014.

*Primary Examiner* — J. San Martin
(74) *Attorney, Agent, or Firm* — Arent Fox LLP

(57) ABSTRACT

A vibrating device having vibrating arms connected to a supporter. The vibrating arms have an n-type Si layer which is a degenerated semiconductor and an exciter provided on the n-type Si layer. The exciter has a piezoelectric thin film and a first and second electrodes with the piezoelectric thin film interposed therebetween.

19 Claims, 13 Drawing Sheets

(56) References Cited

U.S. PATENT DOCUMENTS

| | | |
|---|---|---|
| 8,098,002 B2 | 1/2012 | Baborowski et al. |
| 2007/0227333 A1 | 10/2007 | Higuchi et al. |
| 2008/0105052 A1* | 5/2008 | Takahashi .......... G01C 19/5607 73/504.16 |
| 2010/0013360 A1* | 1/2010 | Baborowski ............. H03H 3/04 310/370 |
| 2010/0127596 A1 | 5/2010 | Ayazi et al. |
| 2010/0127798 A1 | 5/2010 | Ayazi et al. |
| 2013/0312519 A1* | 11/2013 | Ichikawa ........... G01C 19/5607 73/504.12 |
| 2015/0022275 A1* | 1/2015 | Yamazaki ............ H03H 9/1014 331/158 |
| 2016/0064642 A1* | 3/2016 | Nishimura ......... H03H 9/02448 310/311 |
| 2016/0065173 A1* | 3/2016 | Nishimura .......... H01L 41/0478 310/363 |
| 2016/0072473 A1* | 3/2016 | Nishimura ............... H03H 9/21 310/370 |
| 2016/0156332 A1* | 6/2016 | Umeda .................. H03H 9/174 310/321 |
| 2016/0197597 A1* | 7/2016 | Yamada ............... H03H 3/0072 310/311 |
| 2016/0329877 A1* | 11/2016 | Nishimura ......... H03H 9/02244 |

FOREIGN PATENT DOCUMENTS

| | | |
|---|---|---|
| JP | 09-330892 | 12/1997 |
| JP | 2007-267109 A | 10/2007 |
| JP | 2009-264886 A | 11/2009 |
| JP | 2012-510234 A | 4/2012 |
| JP | 2012-105044 A | 5/2012 |
| WO | WO 2010/044058 | 4/2010 |
| WO | WO 2012/110708 A1 | 8/2012 |

\* cited by examiner

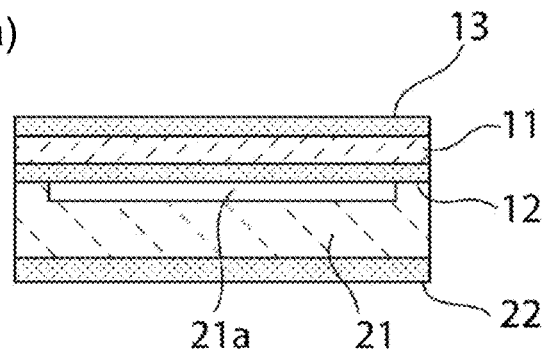
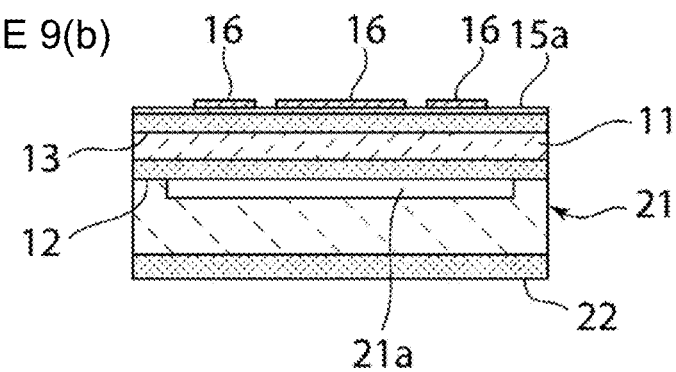
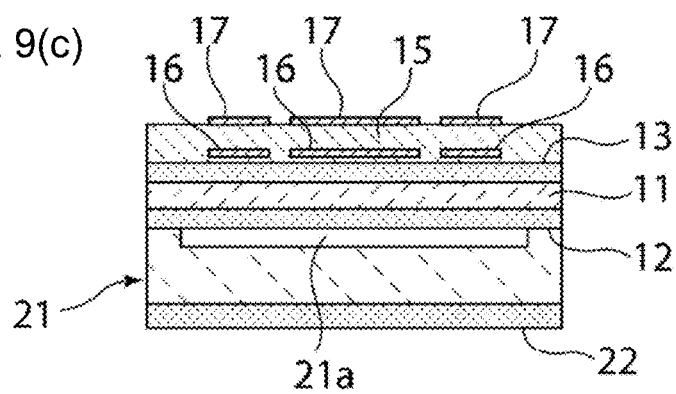
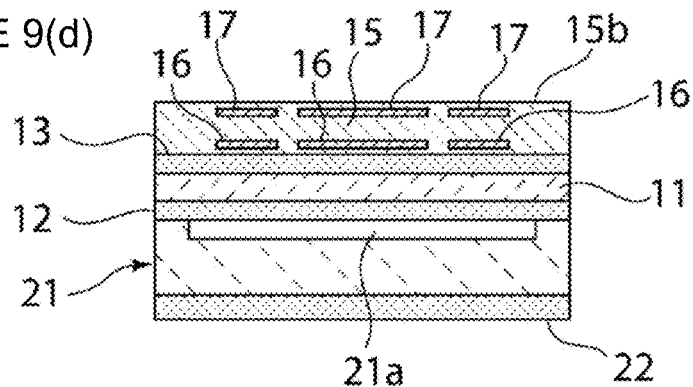

VIBRATING DEVICE AND MANUFACTURING METHOD THERFOR

CROSS REFERENCE TO RELATED APPLICATIONS

The present application is a continuation of International application No. PCT/JP2013/073323, filed Aug. 30, 2013, which claims priority to Japanese Patent Application No. 2012-201878, filed Sep. 13, 2012, the entire contents of each of which are incorporated herein by reference.

FIELD OF THE INVENTION

The present invention relates to a vibrating device having a vibrating arm which is connected to a supporter, and a manufacturing method therefor. More specifically, the present invention relates to a vibrating device having an exciter configured to vibrate the vibrating arm in a bending vibration mode, and a manufacturing method therefor.

BACKGROUND OF THE INVENTION

Conventionally, micro electro mechanical systems (MEMS) which have an exciter configured to include a piezoelectric thin film provided on an Si semiconductor layer are known. For example, Patent Literature 1 discloses a vibrating device wherein one ends of a plurality of vibrating arms are each connected to a supporter. In this vibrating device, the vibrating arms have each an Si semiconductor layer, and an $SiO_2$ film is provided on the Si semiconductor layer. On the $SiO_2$ film, a first electrode, a piezoelectric thin film, and a second electrode are laminated in this order. More specifically, the exciter including the piezoelectric thin film is constituted on the Si semiconductor layer. The vibrating device disclosed in Patent Literature 1 uses bulk waves.

Since the exciter is provided on the Si semiconductor layer, a vibrator with a high Q value can be constituted. In the vibrating device disclosed in Patent Literature 1, an $SiO_2$ film with a relatively large thickness of 2 μm or more is provided to improve temperature characteristics.

Disclosed in Patent Literature 2 is a surface acoustic wave semiconductor device including an n-type Si substrate doped with P. It is said that elastic coefficients and velocities of surface acoustic waves can be changed by using the n-type Si substrate doped with P and the temperature characteristics can be improved thereby.

Patent Literature 1: U.S. Pat. No. 8,098,002
Patent Literature 2: Japanese Patent Laid-Open No. 57-162513

SUMMARY OF THE INVENTION

In the vibrating device which uses the bulk waves disclosed in Patent Literature 1, the $SiO_2$ film with a relatively large thickness of 2 μm or more needs to be provided to improve the temperature characteristics as described above. Although Patent Literature 1 discloses the $SiO_2$ film formed by a thermal oxidation method, the thermal oxidation method, if used to form $SiO_2$ films having a certain thickness or more, causes considerable decrease in a growth rate of the $SiO_2$ films. This makes it difficult to form the $SiO_2$ films with a thickness of 2 μm or more.

Contrary to the thermal oxidation method, spattering and CVD methods can be used for easy formation of thick $SiO_2$ films. However, the $SiO_2$ films formed by these methods are poor in a mechanical loss Qm. This causes a problem of a reduced Q value of the vibrators.

In Patent Literature 1, doping the Si semiconductor layer with impurities is not particularly mentioned.

The surface acoustic wave semiconductor device disclosed in Patent Literature 2 relates to the structure of exciting the surface waves, which is different from the vibrating device using bulk waves as disclosed in Patent Literature 1. Patent Literature 2 only suggests that elastic coefficients and/or velocities of surface acoustic waves are changed by using the n-type Si substrate doped with P and thereby the temperature characteristics are changed.

An object of the present invention is to provide a vibrating device excellent in temperature characteristics and resistant to reduction in a Q value, and a manufacturing method therefor.

A vibrating device according to the present invention includes a supporter and a vibrating arm connected to the supporter. In the present invention, the vibrating arm includes an n-type Si layer which is a degenerated semiconductor and an exciter provided on the n-type Si layer. The exciter has a piezoelectric thin film and first and second electrodes provided with the piezoelectric thin film interposed therebetween, the exciter causing bending vibration of the vibrating arm.

In another broad aspect of the present invention, the vibrating arm has an n-type Si layer having a doping concentration of $1 \times 10^{19}/cm^3$ or more, and an exciter provided on the n-type Si layer, and the exciter has a piezoelectric thin film and first and second electrodes provided with the piezoelectric thin film interposed therebetween, the exciter causing bending vibration of the vibrating arm.

In one specific aspect of the vibrating device of the present invention, the vibrating arms are provided in an odd number, and the exciter is configured to cause out-of-plane bending vibration of the vibrating arms.

In another specific aspect of the vibrating device according to the present invention, the vibrating arms are provided in an even number, and the exciter is configured to cause in-plane bending vibration of the vibrating arms.

In still another specific aspect of the vibrating device according to the present invention, the vibrating arm has a mass addition unit provided in an end portion opposite to an end portion connected to the supporter.

In yet another specific aspect of the vibrating device according to the present invention, a silicon oxide film is placed between the n-type Si layer and the exciter.

In yet another specific aspect of the vibrating device according to the present invention, the silicon oxide film is formed by a thermal oxidation method.

In still another broad aspect of the vibrating device according to the present invention, a method for manufacturing the vibrating device configured according to the present invention is provided. The manufacturing method of the present invention includes the steps of: preparing an n-type Si layer connected to a supporter; forming a first electrode on the n-type Si layer; forming a piezoelectric thin film on the first electrode; and constituting a second electrode on the piezoelectric thin film.

In one specific aspect of the method for manufacturing the vibrating device according to the present invention, the step of preparing the structure in which the n-type Si layer is connected to the supporter includes: preparing a support substrate made of Si and having a recess portion on one surface thereof; and laminating an n-type Si layer over the recess portion of the support substrate.

In the vibrating device according to the present invention, an exciter has first and second electrodes with a piezoelectric thin film interposed therebetween, and the exciter is provided on a degenerated semiconductor that is an n-type Si layer having a doping concentration of $1 \times 10^{19}/cm^3$ or more. As a result, excellent temperature characteristics are provided. This makes it possible to avoid using a film, such as a thick $SiO_2$ film, which improves the temperature characteristics but causes a reduced Q value. As a result, reduction in the Q value is less likely to occur.

BRIEF DESCRIPTION OF THE DRAWINGS

FIGS. 9(a) to 9(d) are cross-sectional views illustrating the method for manufacturing the vibrating device according to the first embodiment of the present invention.

DETAILED DESCRIPTION OF THE PREFERRED EMBODIMENTS

Hereinafter, detailed embodiments of the present invention will be described with reference to the drawings to disclose the present invention.

Figure 1:
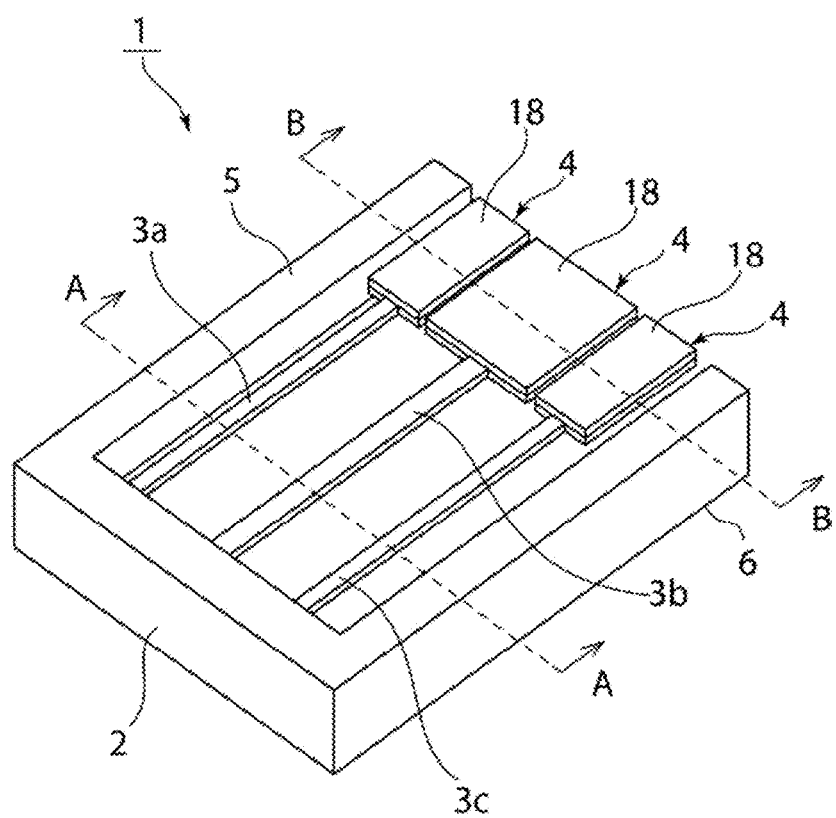
FIG. 1 is a perspective view illustrating an external appearance of a vibrating device according to a first embodiment of the present invention.

FIG. 1 is a perspective view illustrating an external appearance of a vibrating device 1 according to the first embodiment of the present invention. The vibrating device 1 is a resonance-type vibrator including a supporter 2, an odd number of vibrating arms 3a, 3b, and 3c, and a mass addition unit 4. One ends of the vibrating arms 3a to 3c are each connected to the supporter 2. The other ends of the vibrating arms 3a to 3c are each provided with the mass addition unit 4.

The one ends of the vibrating arms 3a to 3c are fixed ends connected to the supporter 2. The other ends are free ends that can be displaced. More specifically, the vibrating arms 3a to 3c are cantilevered by the supporter 2. The odd numbers of the vibrating arms 3a to 3c are elongated in parallel with each other.

Side frames 5 and 6 are connected to both ends of the supporter 2 so as to extend in parallel with the vibrating arms 3a to 3c. The supporter 2 and the side frames 5 and 6 are integrally formed. The structure having the supporter 2 and the side frames 5 and 6, and the structure of a principal part of the vibrating arms 3a to 3c will be disclosed by a later-described manufacturing method therefor.

Figure 2:
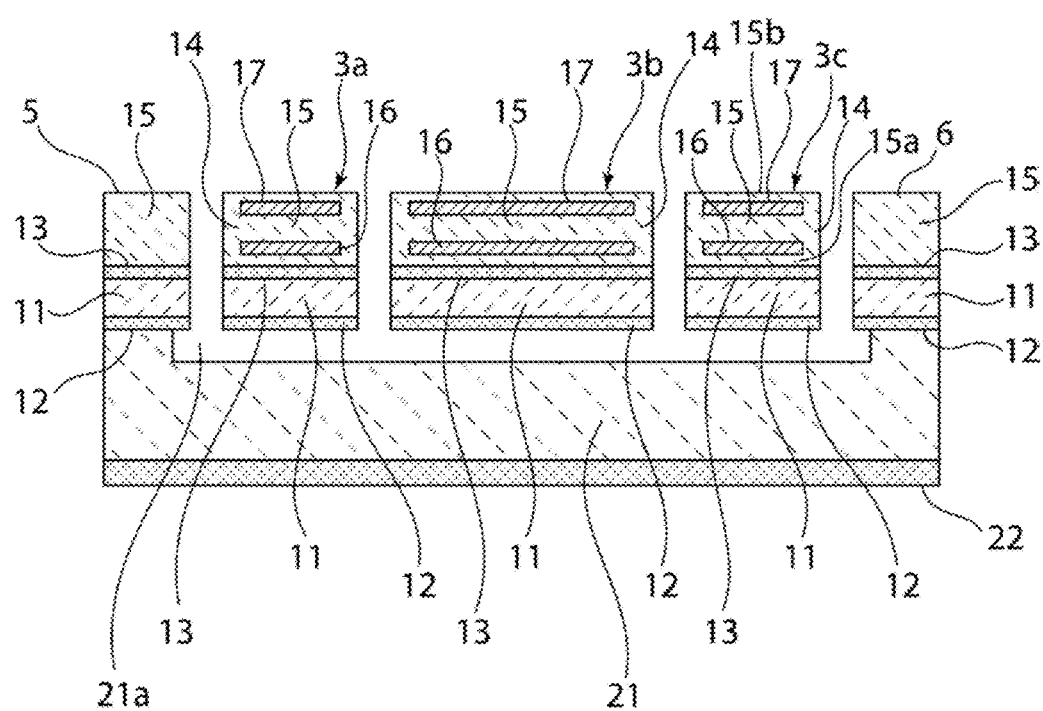
FIG. 2 is a cross-sectional view of a portion along A-A line in FIG. 1.

FIG. 2 is a cross-sectional view of a portion along A-A line in FIG. 1. As illustrated in FIG. 2, the vibrating arms 3a to 3c are constituted of an $SiO_2$ film 12, an n-type Si layer 11, an $SiO_2$ film 13, and an exciter 14.

The n-type Si layer 11 is made of an n-type Si semiconductor which is a degenerated semiconductor. Therefore, a doping concentration of the n-type dopant is $1 \times 10^{19}/cm^3$ or more. Examples of the n-type dopant include a group 15 element, such as P, As, or Sb.

The $SiO_2$ film 12 is provided on the lower surface of the n-type Si layer 11, while the $SiO_2$ film 13 is provided on the upper surface of the n-type Si layer 11. The thickness of the $SiO_2$ films 12 and 13 is 0.4 μm. The $SiO_2$ films 12 and 13 are provided to further improve the temperature characteristics. However, in the present invention, the $SiO_2$ films 12 and 13 may not necessarily be provided as disclosed in a later-described third embodiment of the present invention.

The exciter 14 is provided on the upper surface of the $SiO_2$ film 13. The exciter 14 has a piezoelectric thin film 15, a first electrode 16, and a second electrode 17. The first electrode 16 and the second electrode 17 are provided with the piezoelectric thin film 15 interposed therebetween. A piezoelectric thin film 15a is provided on the upper surface of the $SiO_2$ film 13, and a piezoelectric thin film 15b is provided on the upper surfaces of the piezoelectric thin film 15 and the second electrode 17. The piezoelectric thin film 15a is a seed layer, and the piezoelectric thin film 15b is a protection layer. These layers are not component members of the exciter 14. The piezoelectric thin films 15a and 15b may not necessarily be provided.

Although a piezoelectric material that constitutes the piezoelectric thin film 15 is not limited in particular, the material preferably has a high Q value in the vibrating device using bulk waves. Therefore, AlN is preferably used which is small in an electric mechanical coupling coefficient $k^2$ but high in a Q value. However, ZnO, Sc-substituted AlN, PZT, KNN, or the like may also be used. An Sc-substituted AlN film (ScAlN) preferably has an Sc concentration of about 0.5 at % to 50 at % when the atomic percentage of Sc and Al is 100 at %. Since ScAlN is larger in the electric mechanical coupling coefficient $k^2$ than AlN and larger in the mechanical Qm than PZT and KNN, the following advantages are provided when ScAlN is applied to a resonance-type vibrator as in the present invention. One of the applications of the resonance-type vibrator is oscillators. For example, in a temperature compensation oscillator (TCXO), signals of an incorporated temperature sensor are fed back to a variable capacity element serially connected to a vibrator, and a capacity value of the variable capacity element is changed so that an oscillating frequency can be adjusted. In this case, a fractional bandwidth of the resonance-type vibrator is increased by using ScAlN instead of AlN as a piezoelectric thin film, so that the oscillating frequency can be adjusted in a wider range. Similarly, when ScAlN is applied to a voltage controlled oscillator (VCXO), the oscillating frequency can be adjusted in a wider range. As a result, in the resonance-type vibrator, frequency variations in early stages can be adjusted with the variable capacity element, which can achieve substantial cost reduction in a frequency adjustment process.

The first and second electrodes 16 and 17 may be formed from a proper metal such as Mo, Ru, Pt, Ti, Cr, Al, Cu, Ag, or alloys of these materials.

Figure 3A:
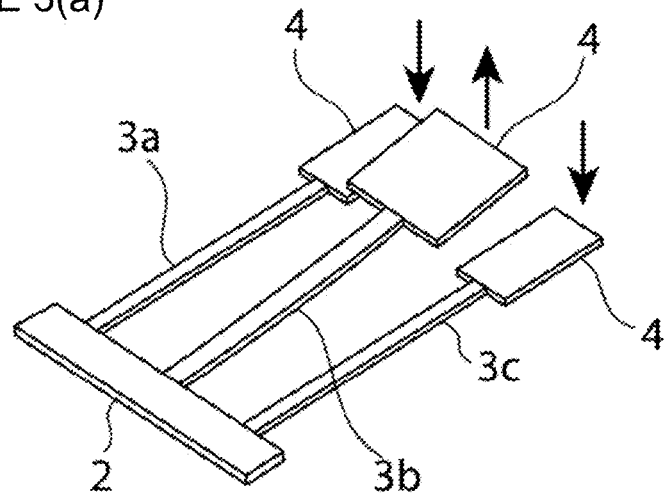
FIGS. 3(a) and 3(b) are schematic perspective views illustrating vibrating states of the vibrating device according to the first embodiment of the present invention.
Figure 3B:
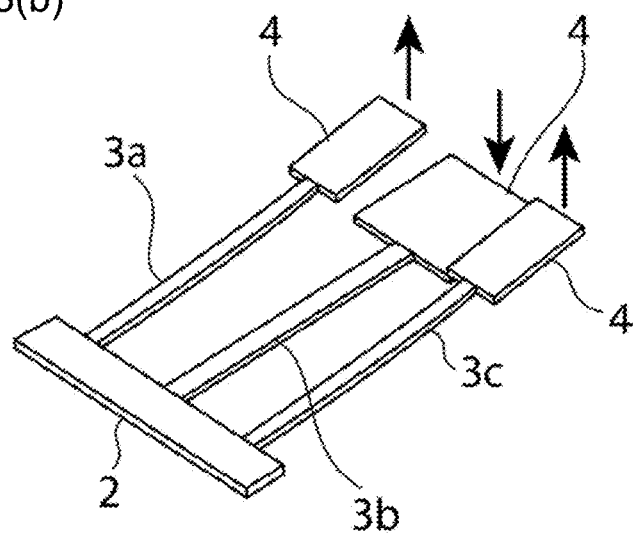

The piezoelectric thin film 15 is polarized in a thickness direction. Therefore, when an alternating electric field is applied to between the first and second electrode 16 and 17, the exciter 14 is excited due to a piezoelectric effect. As a result, vibrating arms 3a to 3c bend and vibrate to have a vibrating mode as illustrated in FIGS. 3(a) and 3(b). As is clear from FIGS. 3(a) and 3(b), the central vibrating arm 3b and the vibrating arms 3a and 3c on both sides are displaced with their phases opposite from each other. This displacement can be achieved by applying an alternating electric field to the central vibrating arm 3b with a phase opposite to a phase of an alternating electric field applied to the vibrating arms 3a and 3c on both the sides. Alternatively, a polarization direction in the piezoelectric thin film 15 in the central vibrating arm 3b may be made different from that of the vibrating arms 3a and 3c on both sides.

The side frames 5 and 6 are constituted of an $SiO_2$ film 22, an Si substrate 21, an $SiO_2$ film 12, an n-type Si layer 11, an $SiO_2$ film 13 and a piezoelectric thin film 15. The supporter 2 is also constituted in a similar way as the side frames 5 and 6. A recess portion 21a is formed on the upper surface of the Si substrate 21, and part of a sidewall of the recess portion 21a constitutes the supporter 2 and the side frames 5 and 6. The vibrating arms 3a to 3c are placed on the recess portion 21a. The Si substrate 21 is a support substrate which constitutes the supporter 2 and the side frames 5 and 6. The $SiO_2$ film 22 is a protection layer which is provided on the lower surface of the Si substrate 21.

The mass addition unit 4 is provided at each of the top ends of the vibrating arms 3a to 3c. In the present embodiment, the mass addition unit 4 is made into the shape of a rectangular plate larger in a width direction than the vibrating arms 3a to 3c.

Figure 4:
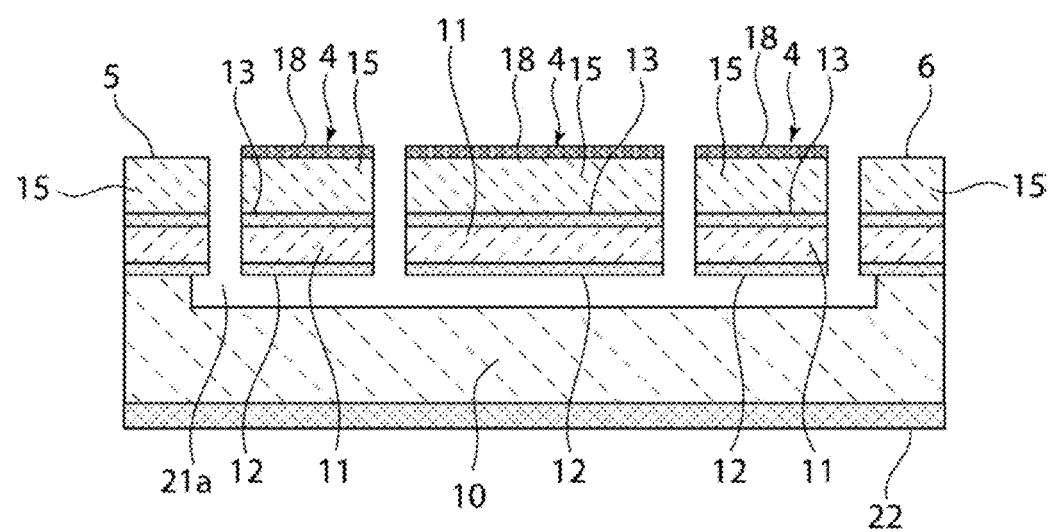
FIG. 4 is a cross-sectional view of a portion along B-B line in FIG. 1.

FIG. 4 is a cross-sectional view of a portion along B-B line in FIG. 1. As illustrated in FIG. 4, the mass addition unit 4 is constituted of a lamination of an $SiO_2$ film 12, an n-type Si layer 11, an $SiO_2$ film 13, a piezoelectric thin film 15, and a mass addition film 18. The mass addition film 18 is made of Au and is provided on the upper surface side of the mass addition unit 4, i.e., on the upper surface of the piezoelectric thin film 15. The mass addition film 18 may be made of Au, or proper metal with high density such as W, Mo or Pt, or alloys thereof. The mass addition film 18 may be further provided on the lower surface side of the mass addition unit 4, i.e., the lower surface of the $SiO_2$ film 12.

As described in a later-described manufacturing process, the mass addition unit 4 has a laminated structure constituted of the $SiO_2$ film 12, the n-type Si layer 11, the $SiO_2$ film 13, and the piezoelectric thin film 15 like the side frames 5 and 6. Accordingly, the mass addition unit 4 preferably has the mass addition film 18 placed only on the upper surface side as in the present embodiment. Since the mass addition unit 4 has a function of adding mass to the top ends of the vibrating arms 3a to 3c, the mass addition unit 4 can serve the function when the mass addition unit 4 is larger in the width direction than the vibrating arms 3a to 3c as described before. Therefore, the mass addition film 18 may not necessarily be provided.

Figure 10:
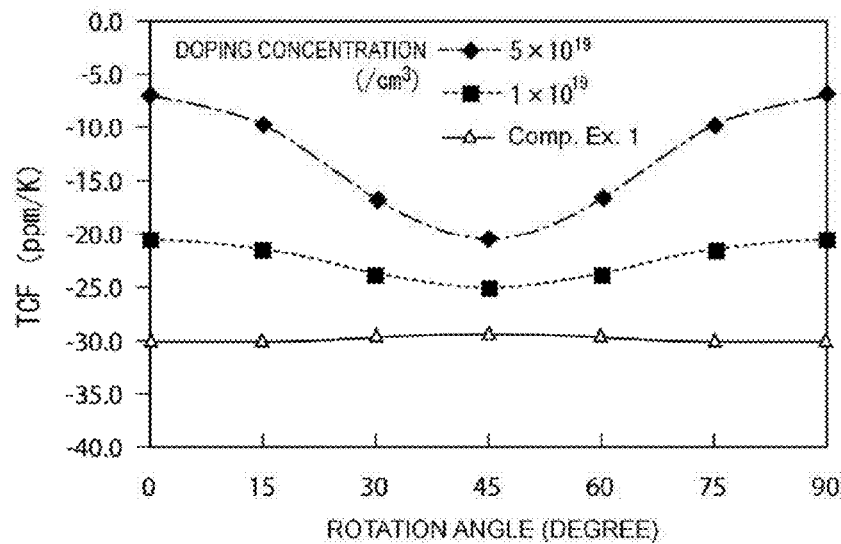
FIG. 10 illustrates the relationship between a rotation angle, a frequency temperature coefficient TCF, and a doping concentration of an n-type dopant in an n-type Si layer in the vibrating device according to the first embodiment of the present invention, the rotation angle being indicative of the relationship between a longitudinal direction of a vibrating arm and a direction of an Si crystal axis in the n-type Si layer.

According to the vibrating device 1 of the present embodiment, an absolute value of the frequency temperature coefficient TCF can be decreased. A description thereof will be given with reference to FIGS. 10 and 11. FIG. 10 illustrates the relationship between a rotation angle of the n-type Si layer 11, a TCF, and a doping concentration of an n-type dopant in the n-type Si layer 11 in the vibrating device 1.

The rotation angle as an abscissa of FIG. 10 represents the relationship between a longitudinal direction of the vibrating arms 3a to 3c and a direction of an Si crystal axis in the n-type Si layer 11. For example, in the case of [100], the rotation angle is 0 degrees. In the case of [110], the rotation angle is 45 degrees. In the case of [010]=[100], the rotation angle is 90 degrees. More specifically, 90 degrees in the case of [010] is equivalent to 0 degrees in the case of [100].

Figure 11:
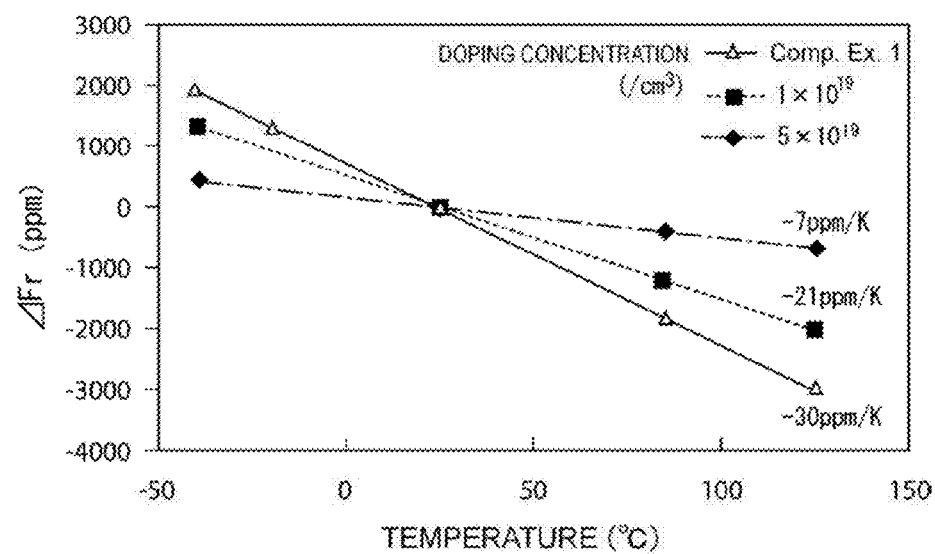
FIG. 11 illustrates the relationship between temperature, a ratio of change in resonance frequency, and a doping concentration of the n-type dopant in the n-type Si layer in the vibrating device according to the first embodiment of the present invention.

FIG. 11 illustrates the relationship between temperature, a ratio of change in resonance frequency ΔFr, and the doping concentration of the n-type dopant in the n-type Si layer 11 in the vibrating device 1. FIG. 11 illustrates a result when the rotation angle is 0 degrees.

FIGS. 10 and 11 illustrate the cases where the doping concentration of the n-type dopant is set to $5 \times 10^{19}/cm^3$ and $1 \times 10^{19}/cm^3$ in the vibrating device 1 of the present embodiment. FIGS. 10 and 11 also illustrate the case of a comparative example 1 similar in configuration to the vibrating device 1 of the present embodiment except for the point that the doping concentration of the n-type dopant in the n-type Si layer is $1 \times 10^{18}/cm^3$.

As is clear from FIG. 10, the TCF can be improved by increasing the doping concentration of the n-type dopant in the n-type Si layer. In addition, FIG. 10 indicates that the TCF changes with change in rotation angle. In the case of the comparative example 1 where the doping concentration is $1 \times 10^{18}/cm^3$, the n-type Si layer is not a degenerated semiconductor. Accordingly, the absolute value of the TCF is large and there is almost no change in TCF when the rotation angle changes. Contrary to this, in the vibrating device 1 having a doping concentration of $1 \times 10^{19}/cm^3$ or more, the absolute value of the TCF can be decreased more effectively by selecting the rotation angle.

As illustrated in FIG. 11, in the vibrating device 1 with a doping concentration of $1\times10^{19}/cm^3$ or more, the ratio of change in resonance frequency ΔFr decreases as the temperature changes.

Therefore, in the present embodiment, the doping concentration of the n-type dopant in the n-type Si layer 11 needs to be $1\times10^{19}/cm^3$ or more as described in the foregoing. In other words, the n-type Si layer 11 needs to be a semiconductor layer operative as a degenerated semiconductor.

As described above, the vibrating device 1 of the present embodiment includes the n-type Si semiconductor which is a degenerated semiconductor, i.e., which contains an n-type dopant with a doping concentration of $1\times10^{19}/cm^3$ or more, so that the absolute value of the TCF can effectively be decreased.

Although the $SiO_2$ films 12 and 13 are provided in the present embodiment, they are as thin as 0.4 μm. In spite of their thinness, the absolute value of the TCF can effectively be decreased as described in the foregoing. As a result, reduction in the Q value is less likely to occur.

While, the manufacturing method for the vibrating device 1 is not particularly specified, one example of the method will be described with reference to FIGS. 8(a) to 8(d) and FIGS. 9(a) to 9(d).

Figure 8A:
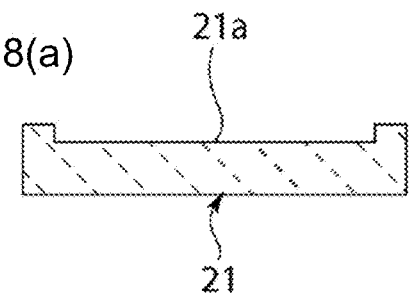
FIGS. 8(a) to 8(d) are cross-sectional views illustrating a method for manufacturing the vibrating device according to the first embodiment of the present invention.

First, as illustrated in FIG. 8(a), an Si substrate 21 is prepared. A recess portion 21a is formed on the upper surface of the Si substrate 21 by etching. The depth of the recess portion 21a may be about 10 μm to 30 μm.

Figure 8B:
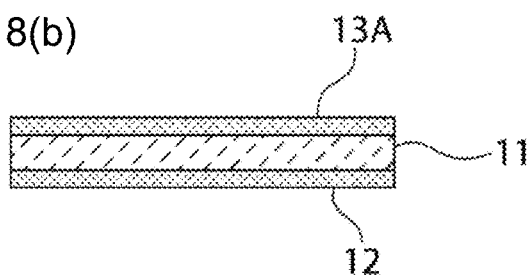

Then, as illustrated in FIG. 8(b), an n-type Si layer 11 doped with P with a doping concentration of $1\times10^{19}/cm^3$ or more is prepared, and $SiO_2$ films 12 and 13A are formed on the upper surface and the lower surface of the n-type Si layer 11. The $SiO_2$ films 12 and 13A are formed by the thermal oxidation method. The $SiO_2$ film formed by the thermal oxidation method is desirable since reduction in Q value is less likely to occur. The thickness of the $SiO_2$ films 12 and 13A is 0.4 μm.

Figure 8C:
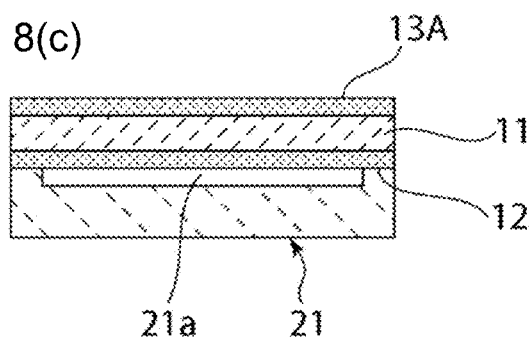

Then, as illustrated in FIG. 8(c), the n-type Si layer 11 with the $SiO_2$ films 12 and 13A formed thereon is laminated on the Si substrate 21. At the time of lamination, the $SiO_2$ film 12 is brought into contact with a surface of the Si substrate 21 on which the recess portion 21a is provided.

Figure 8D:
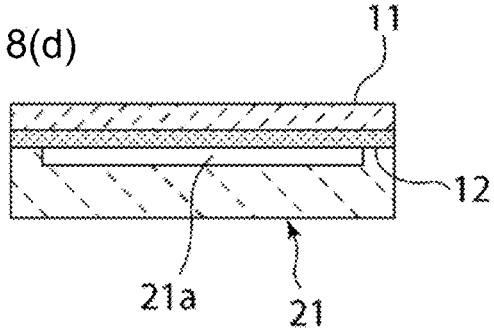

Then, as illustrated in FIG. 8(d), the $SiO_2$ film 13A is removed by polishing to further reduce the thickness of the n-type Si layer 11. As a result, the thickness of the n-type Si layer 11 is reduced to about 10 μm.

Next, the thermal oxidation method is used, as illustrated in FIG. 9(a), to form an $SiO_2$ film 13 on the upper surface of the n-type Si layer 11 and to also form an $SiO_2$ film 22 on the lower surface of the Si substrate 21. The thickness of the $SiO_2$ film is 0.4 μm.

Next, as illustrated in FIG. 9(b), a piezoelectric thin film 15a made of AlN is formed on the upper surface of the $SiO_2$ film 13 with a thickness of about 30 nm to 100 nm, and then a first electrode 16 is formed on the upper surface of the piezoelectric thin film 15a. The first electrode 16 is a laminated electrode formed by laminating a first layer made of Mo and a second layer made of Al. The piezoelectric thin film 15a is a seed layer. Since the piezoelectric thin film 15a is provided, the first layer made of Mo is formed to have a high orientation in the first electrode 16. Then, as illustrated in FIG. 9(c), a piezoelectric thin film 15 made of AlN is formed on the upper surfaces of the piezoelectric thin film 15a and the first electrode 16, and then a second electrode 17 is formed on the upper surface of the piezoelectric thin film 15. The second electrode 17 is a laminated electrode formed by laminating a first layer made of Mo and a second layer made of Al. The first electrode 16 and the second electrode 17 are formed by, for example, a lift-off process involving spattering.

Then, as illustrated in FIG. 9(d), a piezoelectric thin film 15b made of AlN is formed on the upper surfaces of the piezoelectric thin film 15 and the second electrode 17 with a thickness of about 30 nm to 100 nm. Then, a mass addition film 18 made of Au is formed in a region on the upper surface of the piezoelectric thin film 15 where the mass addition unit 4 is to be formed.

Finally, dry etching or wet etching is performed to leave the plurality of vibrating arms 3a to 3c and the mass addition unit 4 illustrated in FIG. 1. Thus, the vibrating device 1 can be obtained.

Figure 5A:
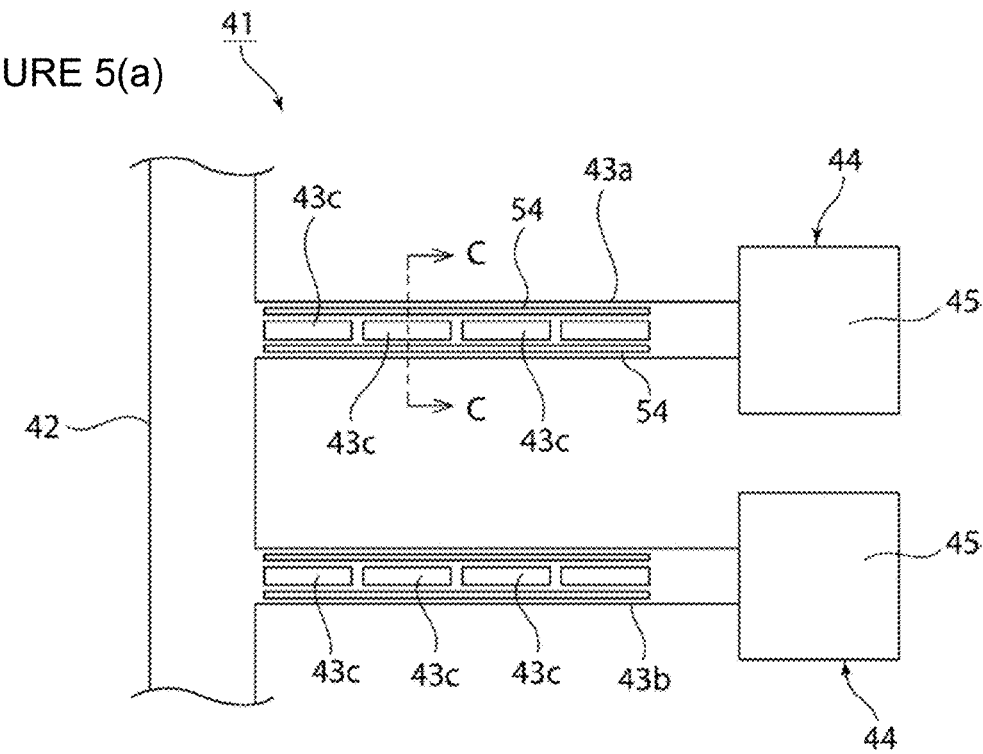
FIG. 5(a) is a simplified plan view illustrating a principal part of a vibrating device according to a second embodiment of the present invention.
Figure 5B:
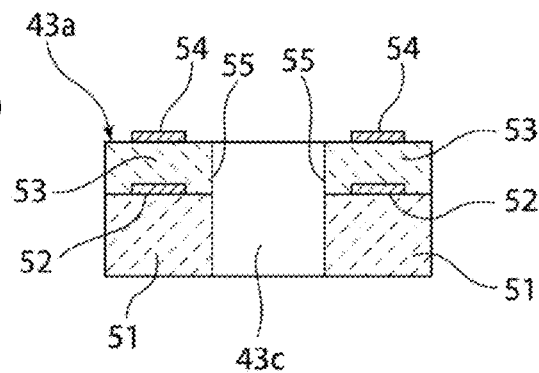
FIG. 5(b) is a cross-sectional view of a portion along C-C line in FIG. 5(a).

FIG. 5(a) is a simplified plan view illustrating a principal part of a vibrating device 41 according to the second embodiment of the present invention, and FIG. 5(b) is a cross-sectional view of a portion along C-C line in FIG. 5(a). The vibrating device 41 is a resonance-type vibrator including a supporter 42, an even number of vibrating arms 43a and 43b, and a mass addition unit 44. Unillustrated side frames are connected to both ends of the supporter 42 so as to extend in parallel with the vibrating arms 43a and 43b.

As illustrated in FIG. 5(a), one ends of the vibrating arms 43a and 43b are each connected to the supporter 42. The other ends of the vibrating arms 43a and 43b are each provided with the mass addition unit 44. The one ends of the vibrating arms 43a and 43b are fixed ends connected to the supporter 42. The other ends are free ends that can be displaced. More specifically, the vibrating arms 43a and 43b are cantilevered by the supporter 42. An even number of the vibrating arms 43a and 43b are elongated in parallel with each other.

As illustrated in FIGS. 5(a) and 5(b), a plurality of through holes 43c are formed in each of the vibrating arms 43a and 43b. The through holes 43c are in a rectangular shape whose longitudinal direction is parallel to a length direction of the vibrating arms 43a and 43b in a plan view. The through holes 43c are provided in the length direction of the vibrating arms 43a and 43b.

FIG. 5(b) illustrates the transverse cross-section of a portion of the vibrating arm 43a where the through hole 43c is provided. The vibrating arm 43a is constituted of an n-type Si layer 51 and an exciter 55 provided on both side portions adjacent to the through hole 43c. The exciter 55 has a first electrode 52, a piezoelectric thin film 53, and a second electrode 54. The first electrode 52 and the second electrode 54 are provided with the piezoelectric thin film 53 interposed therebetween. The vibrating arm 43b is similarly configured.

In the present embodiment, the vibrating arms 43a and 43b are smoothly displaced by the presence of the through holes 43c. The through holes 43c may not necessarily be provided.

Although not illustrated in FIGS. 5(a) and 5(b), the vibrating device 41 has an Si substrate and an $SiO_2$ film provided on the lower surface of the Si substrate as in the first embodiment. In the present embodiment, the supporter 42 and unillustrated side frames are constituted of an $SiO_2$ film, an Si substrate, an n-type Si layer 51, and a piezoelectric thin film 53. The mass addition unit 44 is provided at each of the top ends of the vibrating arms 43a and 43b. In the present embodiment, the mass addition unit 44 is made into the shape of a rectangular plate larger in the width direction than the vibrating arms 43a and 43b. The mass addition unit 44 is constituted of a lamination of the n-type Si layer 51, the piezoelectric thin film 53, and the mass addition film 45. The mass addition film 45 is provided on the upper surface side of the mass addition unit 44, i.e., on the upper surface of the piezoelectric thin film 53.

The n-type Si layer 51 is constituted of an n-type Si semiconductor which is a degenerated semiconductor whose doping concentration of an n-type dopant is $1 \times 10^{19}/cm^3$ or more as in the case of the first embodiment. The first and second electrodes 52 and 54, and the piezoelectric thin film 53 are made of materials identical to those in the first embodiment. However, in the present embodiment, an $SiO_2$ film is not provided on the upper surface and the lower surface of the n-type Si layer 51.

Figure 6:
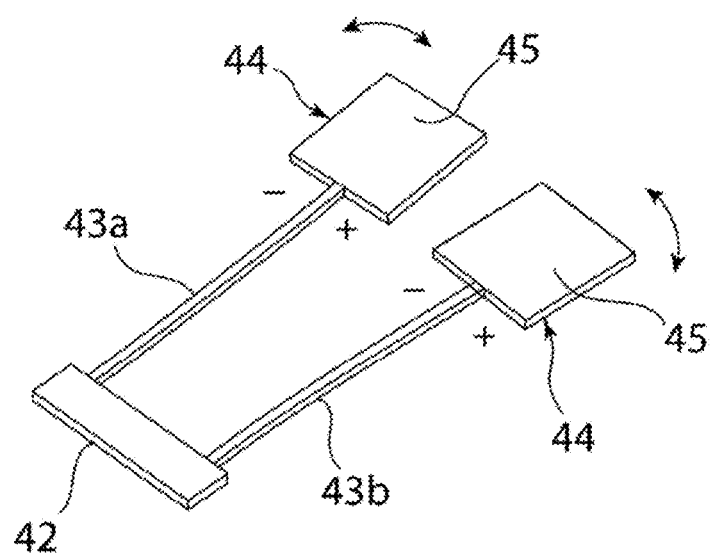
FIG. 6 is a schematic perspective view illustrating a vibrating state of the vibrating device according to the second embodiment of the present invention.

In the vibrating device 41 of the present embodiment, the piezoelectric thin film 53 is polarized in the thickness direction. Therefore, when an alternating electric field is applied to between the first and second electrode 52 and 54, the exciter 55 is excited due to a piezoelectric effect. As a result, the vibrating arms 43a and 43b bend and vibrate to have a vibrating mode as illustrated in FIG. 6. Since an alternating electric field is applied to the vibrating arm 43a with a phase opposite to the phase of an alternating electric field applied to the vibrating arm 43b, the vibrating arm 43a and the vibrating arm 43b are displaced with their phases opposite to each other. The vibrating arms 43a and 43b vibrate in a tuning fork-type in-plane bending vibration mode.

In the vibrating device 41 of the present embodiment, the n-type Si layer 51 constituting the vibrating arms 43a and 43b is also a degenerated semiconductor which is an n-type Si semiconductor with a doping concentration of the n-type dopant being $1 \times 10^{19}/cm^3$ or more. This makes it possible to decrease the absolute value of the frequency temperature coefficient TCF. More specifically, excellent temperature characteristics may be implemented without the formation of the $SiO_2$ film. A description thereof will be given with reference to FIGS. 12 and 13.

Figure 12:
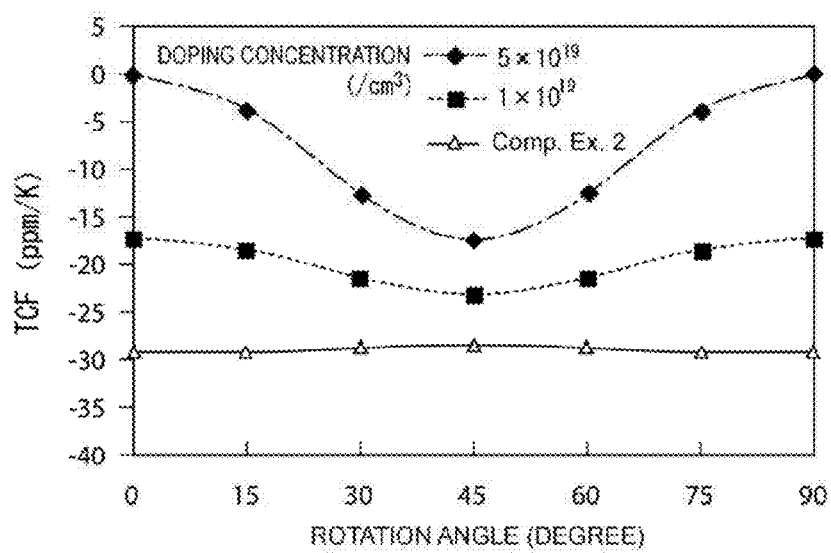
FIG. 12 illustrates the relationship between a rotation angle, a frequency temperature coefficient TCF, and a doping concentration of a n-type dopant in an n-type Si layer in the vibrating device according to the second embodiment of the present invention, the rotation angle being indicative of the relationship between the longitudinal direction of a vibrating arm and the direction of an Si crystal axis in the n-type Si layer.
Figure 13:
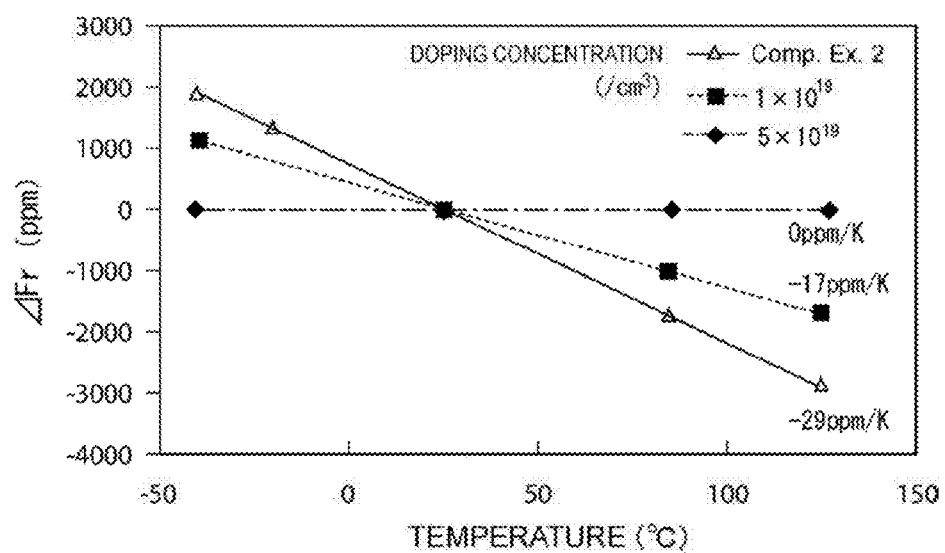
FIG. 13 illustrates the relationship between temperature, a ratio of change in resonance frequency, and a doping concentration of the n-type dopant in the n-type Si layer in the vibrating device according to the second embodiment of the present invention.

FIG. 12 illustrates the relationship between a rotation angle of the n-type Si layer 51, a frequency temperature coefficient TCF, and a doping concentration of an n-type dopant in the n-type Si layer 51 in the vibrating device 41. The rotation angle as an abscissa of FIG. 12 represents the relationship between a longitudinal direction of the vibrating arms 43a and 43b and a direction of an Si crystal axis in the n-type Si layer 51, as in FIG. 10. FIG. 13 illustrates the relationship between temperature, a ratio of change in resonance frequency ΔFr, and the doping concentration of the n-type dopant in the n-type Si layer 51 in the vibrating device 41. FIG. 13 illustrates a result when the rotation angle is 0 degrees.

FIGS. 12 and 13 illustrate the cases where the doping concentration of the n-type dopant is set to $5 \times 10^{19}/cm^3$ and $1 \times 10^{19}/cm^3$ in the vibrating device 41 of the present embodiment. FIGS. 12 and 13 also illustrate the case of a comparative example 2 similar in configuration to the vibrating device 41 of the present embodiment except for the point that the doping concentration of the n-type dopant in the n-type Si layer is $1 \times 10^{18}/cm^3$.

As is clear from FIG. 12, also in the present embodiment, the TCF can be improved by increasing the doping concentration of the n-type dopant in the n-type Si layer, and the TCF also changes with change in rotation angle. In the case of the comparative example 2 where the doping concentration is $1 \times 10^{18}/cm^3$, the n-type Si layer is not a degenerated semiconductor. Accordingly, the absolute value of the TCF is large and there is almost no change in the TCF when the rotation angle changes. Contrary to this, in the vibrating device 41 having a doping concentration of $1 \times 10^{19}/cm^3$ or more, the absolute value of the TCF can be decreased more effectively by selecting the rotation angle.

Furthermore, as illustrated in FIG. 13, in the vibrating device 41 with a doping concentration of $1 \times 10^{19}/cm^3$ or more, the ratio of change in resonance frequency ΔFr is decreased with change in temperature.

As is clear from the vibrating device 41 of the second embodiment, the vibrating device of the present invention may have an even number of vibrating arms vibrating in the tuning fork-type in-plane bending vibration mode. As described in the second embodiment, an $SiO_2$ film may be provided on the upper surface and the lower surface of the n-type Si layer as and when necessary. Even in that case, the absolute value of the TCF can be reduced more effectively.

Figure 7A:
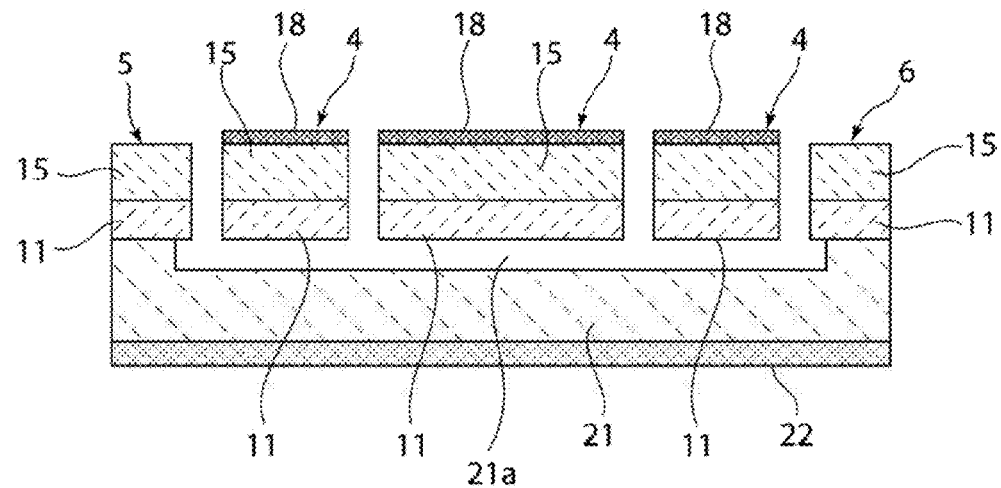
FIG. 7(a) is a transverse cross-sectional view of a vibrating device at a position where a mass addition unit is provided according to a third embodiment of the present invention.
Figure 7B:
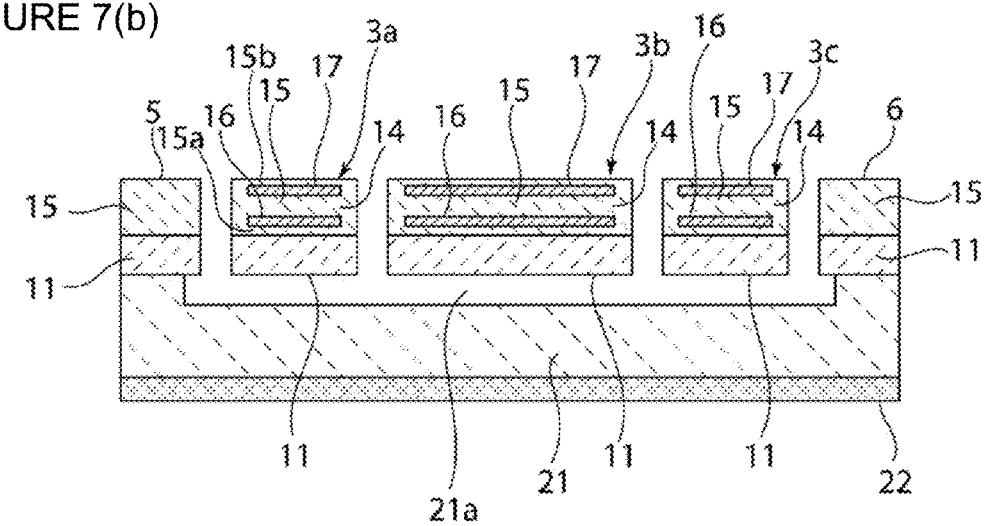
FIG. 7(b) is a transverse cross-sectional view of the vibrating device at a position where a plurality of vibrating arms are provided.

FIGS. 7(a) and 7(b) are transverse cross-sectional views of a vibrating device according to a third embodiment of the present invention. The third embodiment is a modification of the first embodiment. FIG. 7(a) is a transverse cross-sectional view of the vibrating device at a position where a mass addition unit is provided according to the third embodiment of the present invention, and FIG. 7(b) is a transverse cross-sectional view of the vibrating device at a position where a plurality of vibrating arms are provided.

As is clear from FIGS. 7(a) and 7(b), the vibrating device according to the present embodiment is different from the vibrating device 1 of the first embodiment in that the $SiO_2$ film is not provided on the upper surface and the lower surface of the n-type Si layer 11. The device is similar in other structural aspects to the vibrating device 1. Therefore, the description of the first embodiment will be used to omit the description of the present embodiment.

Even when the $SiO_2$ film is not provided on the upper surface and the lower surface of the n-type Si layer 11 as in the vibrating device according to the third embodiment, the absolute value of the frequency temperature coefficient TCF can effectively be reduced since the n-type Si layer 11 is a degenerated semiconductor, i.e., an n-type Si semiconductor with a doping concentration of $1 \times 10^{19}/cm^3$ or more. In the present embodiment, the $SiO_2$ film is not provided on the upper surface and the lower surface of the n-type Si layer 11, so that reduction in the Q value is less likely to occur.

Although the number of vibrating arms is three in the first and third embodiments, the number is not particularly limited as long as it is an odd number. Similarly, although the number of vibrating arms is two in the second embodiment, the number is not particularly limited as long as it is an even number.

As is clear from the first and second embodiments, as long as the bending vibration modes involving bulk waves are used, any one of the out-of-plane bending vibration mode and the in-plane bending vibration mode may be used in the present invention.

Additional Example

Figure 14:
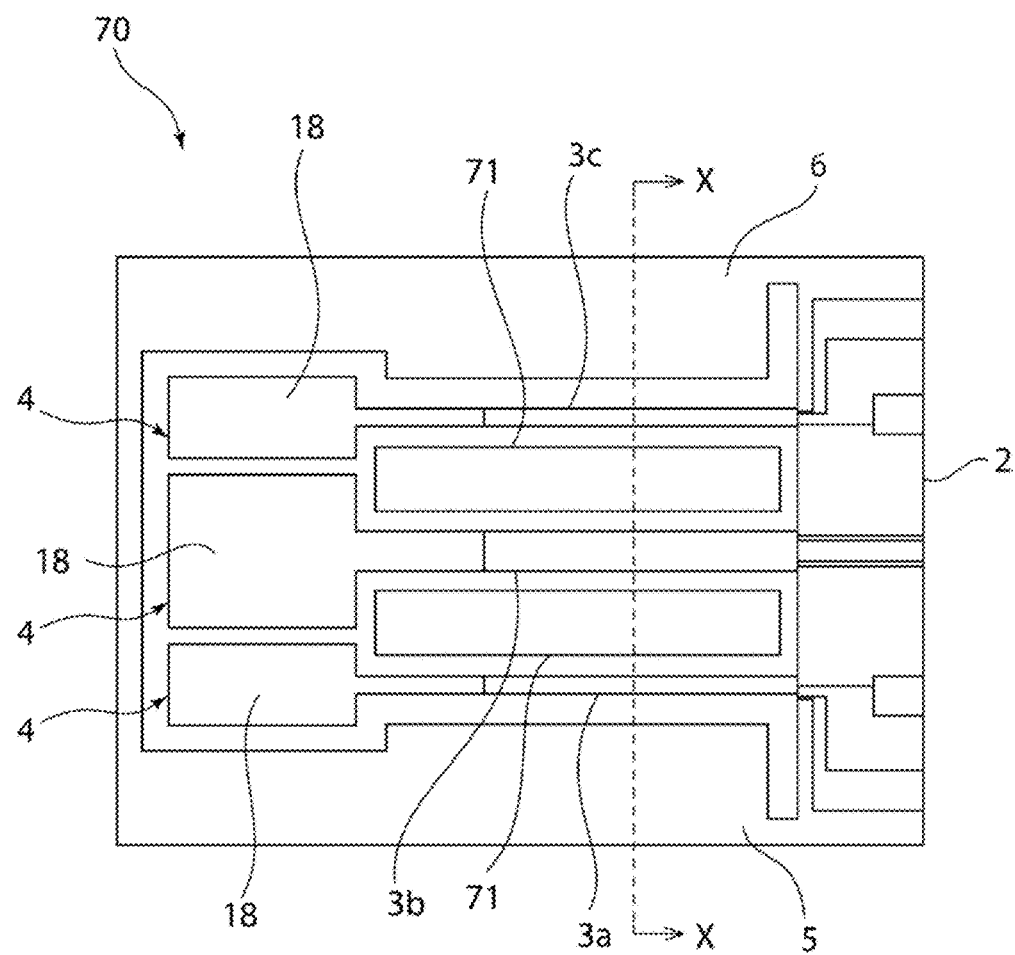
FIG. 14 is a schematic plan view of a vibrating device according to a modification of the first embodiment of the present invention.
Figure 15:
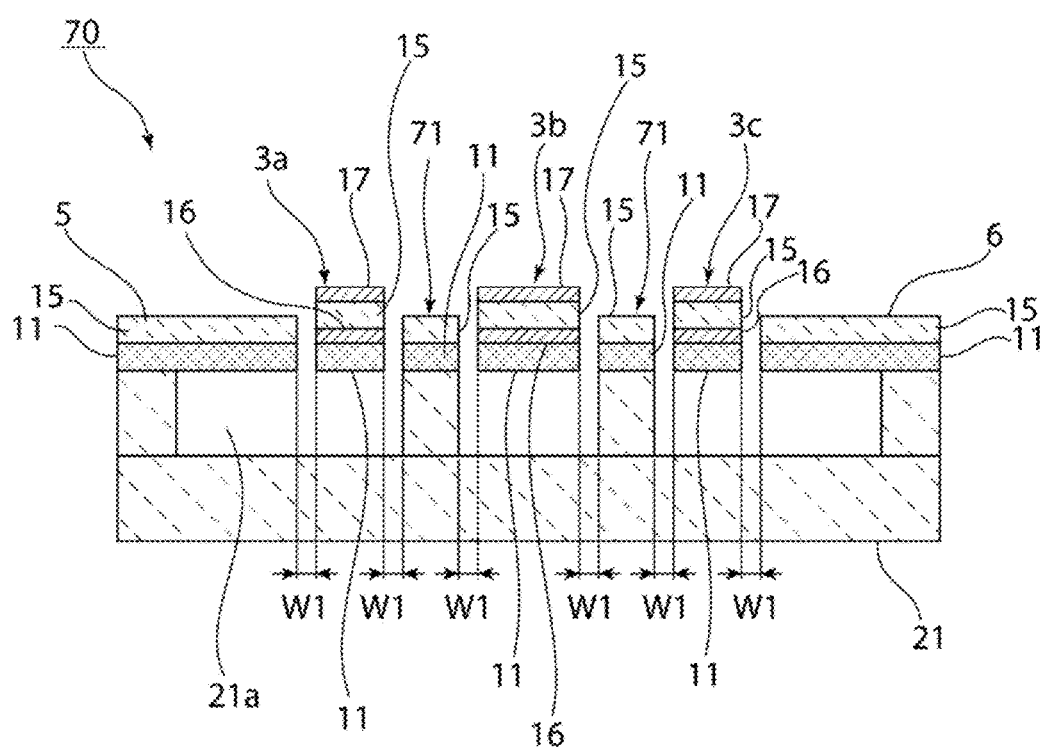
FIG. 15 is a cross-sectional view of a portion along X-X line in FIG. 14.

FIGS. 14 and 15 illustrate a vibrating device 70 according to a modification of the aforementioned vibrating device 1 in the first embodiment. FIG. 14 is a schematic plan view of the vibrating device 70 according to the modification, and FIG. 15 is a cross-sectional view of a portion along X-X line in FIG. 14. The vibrating device 70 of the present modification is different from the vibrating device 1 of the first embodiment in the following points. That is, micro loading effect suppression patterns 71 and 71 described below are provided, the $SiO_2$ film is not provided on the upper surface and the lower surface of the n-type Si layer, the piezoelectric thin film as a seed layer is not provided, and the SiO$_2$ film is not provided on the lower surface of the Si substrate. The vibrating device 70 is similar in other structural aspects to the vibrating device 1.

When the structure illustrated in FIGS. 1 and 5 is formed, dry etching processing is performed to process Si. In the dry etching processing, an etching rate is higher as an aperture width of a portion removed by etching is smaller. This is called a micro loading effect. Accordingly, when portions different in aperture width are mixed in a region subjected to dry etching processing, the etching amount is varied and causes variations in frequency in the vibrating device. Accordingly, in the present invention, it is preferable to place the micro loading effect suppression patterns 71 and 71 as in the modification illustrated in FIGS. 14 and 15 so that the portions removed by etching have a uniform aperture width W1. This makes it possible to suppress the variations in the etching amount. The micro loading effect suppression patterns 71 and 71 have the same laminated structure as in the side frames 5 and 6.

Furthermore, the micro loading effect suppression patterns 71 and 71 also function as a stopper to prevent the vibrating bowls from being significantly displaced and damaged due to impact when products are dropped.

REFERENCE SIGNS LIST

1 Vibrating device
2 Supporter
3a, 3b, 3c Vibrating arm
4 Mass addition unit
5, 6 Side frame
11 n-type Si layer
12, 13, 13A SiO$_2$ film
14 Exciter
15 Piezoelectric thin film
15a, 15b Piezoelectric thin film
16 First electrode
17 Second electrode
18 Mass addition film
21 Si substrate
21a Recess portion
22 SiO$_2$ film
41 Vibrating device
42 Supporter
43a, 43b Vibrating arm
43c Through hole
44 Mass addition unit
45 Mass addition film
51 n-type Si layer
52 First electrode
53 Piezoelectric thin film
54 Second electrode
55 Exciter
70 Vibrating device
71 Micro loading effect suppression pattern The inventiom claimed is:

1. A vibrating device, comprising:
a supporter; and
a vibrating arm connected to the supporter, wherein the vibrating arm has an n-type Si layer which is a degenerated semiconductor and an exciter provided on the n-type Si layer, and
the exciter has a piezoelectric film, and first and second electrodes provided with the piezoelectric film interposed therebetween, the exciter causing bending vibration of the vibrating arm.

2. The vibrating device according to claim 1, wherein
an odd number of the vibrating arms are connected to the supporter, and
the exciter is configured to cause out-of-plane bending vibration of the odd number of the vibrating arms.

3. The vibrating device according to claim 1, wherein
an even number of the vibrating arms are connected to the supporter, and
the exciter is configured to cause in-plane bending vibration of the even number of the vibrating arms.

4. The vibrating device according to claim 1, further comprising:
a mass addition unit provided at a first end of the vibrating arm opposite to a second end of the vibrating arm connected to the supporter.

5. The vibrating device according to claim 1, further comprising a silicon oxide film between the n-type Si layer and the exciter.

6. The vibrating device according to claim 5, wherein the silicon oxide film is a thermally oxidized silicon oxide film.

7. A vibrating device, comprising:
a supporter; and
a vibrating arm connected to the supporter, wherein the vibrating arm has an n-type Si layer having a doping concentration of $1\times10^{19}$/cm$^3$ or more, and an exciter provided on the n-type Si layer, and
the exciter has a piezoelectric film, and first and second electrodes with the piezoelectric film interposed therebetween, the exciter causing bending vibration of the vibrating arm.

8. The vibrating device according to claim 7, wherein
an odd number of the vibrating arms are connected to the supporter, and
the exciter is configured to cause out-of-plane bending vibration of the odd number of the vibrating arms.

9. The vibrating device according to claim 7, wherein
an even number of the vibrating arms are connected to the supporter, and
the exciter is configured to cause in-plane bending vibration of the even number of the vibrating arms.

10. The vibrating device according to claim 7, further comprising:
a mass addition unit provided at a first end of the vibrating arm opposite to a second end of the vibrating arm connected to the supporter.

11. The vibrating device according to claim 7, further comprising a silicon oxide film between the n-type Si layer and the exciter.

12. The vibrating device according to claim 11, wherein the silicon oxide film is a thermally oxidized silicon oxide film.

13. A method for manufacturing a vibrating device, the method comprising:
preparing an n-type Si layer connected to a supporter, the n-type Si layer having an arm portion connected to the supporter;
forming an exciter on the arm portion by:
forming a first electrode on the n-type Si layer;
forming a piezoelectric film on the first electrode; and
forming a second electrode on the piezoelectric film.

14. The method for manufacturing the vibrating device according to claim 13, wherein
the n-type Si layer is connected to the supporter by:
preparing a support substrate made of Si and having a recess portion on one surface thereof; and
laminating the n-type Si layer over the recess portion of the support substrate.

15. The method for manufacturing the vibrating device according to claim 13, wherein the n-type Si layer is a degenerated semiconductor.

16. The method for manufacturing the vibrating device according to claim 13, wherein the n-type Si layer has a doping concentration of $1 \times 10^{19}/cm^3$ or more.

17. The method for manufacturing the vibrating device according to claim 13, further comprising:
providing a mass addition unit at a first end of the arm portion opposite to a second end of the arm portion connected to the supporter.

18. The method for manufacturing the vibrating device according to claim 13, further comprising forming a silicon oxide film between the n-type Si layer and the exciter.

19. The method for manufacturing the vibrating device according to claim 18, wherein the silicon oxide film is formed by a thermal oxidation method.

* * * * *